(12) United States Patent
Ahn

(10) Patent No.: US 6,614,054 B1
(45) Date of Patent: Sep. 2, 2003

(54) POLYSILICON THIN FILM TRANSISTOR USED IN A LIQUID CRYSTAL DISPLAY AND THE FABRICATING METHOD

(75) Inventor: Byung-Chul Ahn, Kumi-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 4 days.

(21) Appl. No.: 09/721,961

(22) Filed: Nov. 27, 2000

(51) Int. Cl.⁷ .................. H01L 29/04; H01L 27/108
(52) U.S. Cl. ................ 257/72; 257/66; 257/70; 257/623
(58) Field of Search ................. 257/57, 59, 66, 257/67, 70, 72, 347, 623, 619; 438/164, 166

(56) References Cited

U.S. PATENT DOCUMENTS

| | | | | | |
|---|---|---|---|---|---|
| 5,120,666 | A | * | 6/1992 | Gotou | 148/DIG. 150 |
| 5,614,729 | A | * | 3/1997 | Ukai et al. | 257/57 |
| 5,682,053 | A | * | 10/1997 | Wiszniewski | 257/401 |
| 5,844,294 | A | * | 12/1998 | Kikuchi et al. | 257/347 |
| 5,858,820 | A | * | 1/1999 | Jung et al. | 438/150 |
| 5,893,948 | A | * | 4/1999 | Nickel et al. | 117/43 |
| 6,020,224 | A | * | 2/2000 | Shimogaichi et al. | 438/158 |
| 6,087,648 | A | * | 7/2000 | Zhang et al. | 250/208.1 |
| 6,211,551 | B1 | * | 4/2001 | Suzumura et al. | 257/343 |

FOREIGN PATENT DOCUMENTS

| | | | | |
|---|---|---|---|---|
| JP | 4-01-307271 | * | 12/1989 | 257/347 |
| JP | 4-04-99065 | * | 3/1992 | 257/347 |
| JP | 4-06-29321 | * | 2/1994 | 257/66 |
| JP | 6-163589 | | 6/1994 | |

* cited by examiner

Primary Examiner—George Eckert
(74) Attorney, Agent, or Firm—McKenna, Long & Aldridge LLP

(57) ABSTRACT

A thin film transistor includes a substrate having an upper side; a plurality of parallel-connected active layers supported on the upper side of the substrate; spaces defined between the substrate and the active layers; a first insulating layer on the plurality of active layers; a gate electrode on the first insulating layer over the plurality of active layers; and source and drain electrodes contacting the plurality of the active layers. The active layers of the thin film transistor are laser annealed to polycrystalline silicon. The spaces result in large polysilicon grains that result in good electrical characteristics.

15 Claims, 11 Drawing Sheets

POLYSILICON THIN FILM TRANSISTOR USED IN A LIQUID CRYSTAL DISPLAY AND THE FABRICATING METHOD

BACKGROUND OF THE INVENTION

1. Field of the Invention

The present invention relates to a thin film transistor (TFT) of the type used in a liquid crystal display (LCD). More particularly, it relates to a polycrystalline silicon thin film transistor (Poly-Si TFT) and a method of manufacturing the same.

2. Discussion of the Related Art

Generally, in order to form a polycrystalline silicon membrane, intrinsic amorphous silicon is first deposited by conventional methods, for example, Plasma Chemical Vapor Deposition (PCVD) or Low Pressure CVD (LPCVD). Then that amorphous silicon is crystallized. The crystallization methods can be classified into three types.

Firstly, a metal induced crystallization (MIC) technique. The MIC technique can use large size glass substrates, since the MIC technique can use a low crystallization temperature.

Secondly, a solid phase crystallization (SPC) technique. SPC changes amorphous silicon into polycrystalline silicon by heat-treatment at a high temperature for a long time. It requires forming a buffer layer on a quartz substrate in order to prevent the quartz substrate from diffusing an impurity material. The amorphous silicon layer is then deposited on the buffer layer and crystallized by the heat-treatment.

Thirdly, a laser annealing technique grows polycrystalline silicon using laser irradiation while heating a substrate having an amorphous silicon membrane.

Although metal induced crystallization (MIC) can form polycrystalline silicon on large sized glass substrates, the quality of the resulting membrane is questionable due to the high possibility of residual metallic material in the grain boundaries of the polycrystalline silicon.

The solid phase crystallization (SPC) method results in irregular grain boundaries that cause the gate insulating layer on the polycrystalline silicon layer to grow erratically, leading to a low breakdown voltage. Furthermore, since the grain sizes of the polycrystalline silicon are highly non-uniform, the electrical properties of the resulting device, such as the on-current and the threshold voltage, are not good. Finally, a costly quartz substrate should be employed when performing SPC.

The laser annealing technique is widely used and has been carefully investigated. This method can heat amorphous silicon on a glass substrate up to the melting temperature of the silicon without damaging the substrate.

For a more complete understanding of laser annealing, reference is now made to the following descriptions taken in conjunction with the accompanying drawings, in which:

FIGS. 1a to 1d show the fabrication process steps of a TFT according to the related art. Referring to FIG. 1a, a first insulating layer 2 and an amorphous silicon layer 4 are sequentially formed on a substrate 1. The first insulating layer 2 prevents the substrate 1 from effusing alkali. The first insulating layer 2 also acts as an antireflection layer that prevents leakage of the excimer-laser beam used in laser annealing.

FIG. 1b shows the process step of crystallizing the amorphous silicon layer 4. An excimer-laser beam quickly heats the amorphous silicon to its melting temperature. If the excimer-laser irradiation stops, the amorphous silicon cools down quickly. Crystal growth of polycrystalline silicon then occurs with the numerous crystal nuclei acting as starting points or "seeds."

Referring to FIG. 1c, an island-shaped polycrystalline silicon 4 layer is formed by patterning the crystallized poly-silicon. A second insulating material and a first metallic material are deposited sequentially and patterned to form a second insulating layer 6 and a gate electrode 8. Then, the peripheral portion of the polycrystalline silicon 4 is ion-doped using the gate electrode 8 as a mask.

As shown in FIG. 1d, a third insulating layer 11 is deposited and patterned to form contact holes on the doped portions 12 and 13. Then, source and drain electrodes 9 and 10 are formed in and around the contact holes.

However, the conventional laser annealing method uses the numerous crystal nuclei as starting points (seeds) at random. The grain size of the polycrystalline silicon is then about 1 $\mu$m. From these results, as shown in FIG. 2, many small-sized grains 20 are formed in the channel region of the TFT. This means that the grain boundaries, which affect the electrical properties, are numerous. This deteriorates the electrical properties of the TFT.

Referring to FIG. 3, the excimer-laser beam should be irradiated many times to obtain a reliable TFT when large-sized amorphous silicon on a substrate 40 is being crystallized. To accomplish this a second excimer-laser beam 44 can be irradiated over about 90% of the area irradiated by the first excimer-laser. The amorphous silicon is then converted to polycrystalline silicon by repeating the overlap of the laser beams several times.

As the conventional method forms small-sized grains and numerous grain boundaries, it does not produce good electrical properties when the length of TFT channel region is around 10 $\mu$m.

To address these problems, Japanese Journal of Physics (JJAP), pp. 4545–4549, in 1992 and JJAP, pp. 70–74, in 1994 disclose TFTs having a gate electrode with a bridge structure. FIGS. 4 and 5 explain those techniques.

An insulating layer 52 is formed on a silicon wafer 50, which has been constructed by removal of the central portion 50b of the silicon wafer 50 using preferential etching. Then, amorphous silicon 54 is formed on the insulating layer 52. That silicon is then crystallized using an excimer-laser. The grain size of the polycrystalline silicon grows up to 50 $\mu$m. In this method, the peripheral portion 50a of the silicon wafer 50 acts as the bridge, which supports the central portion 50b of the silicon wafer 50.

FIG. 5 shows a cross sectional view of a TFT that is made of polycrystalline silicon formed using that crystallization method (in FIG. 4). A gate electrode 56 is formed under the silicon wafer 52. Patterning yields the polycrystalline silicon active layer 54. After that, source and drain electrodes 58 and 60 are formed.

The field-effect mobility of a TFT fabricated by the method of FIGS. 4 and 5 is similar to that of a MOS (metal oxide silicon) transistor made of amorphous silicon.

These techniques, however, do not explain the method of forming the preferable grain size and shape. Furthermore, the method of fabricating plural uniform devices on a large size substrate is not suggested.

SUMMARY OF THE INVENTION

An object of the present invention is to provide a method of forming a polycrystalline silicon layer having large-sized grains and a TFT fabricated by that method.

In order to achieve the object of the invention, the present invention provides a method of fabricating a thin film transistor (TFT), including: providing a substrate; depositing amorphous silicon on the substrate; patterning the amorphous silicon to form plural island-shaped amorphous silicon layers, the amorphous silicon layers being parallel to each other; forming etched-spaces between the substrate and the amorphous silicon layers by etching the upper side of the substrate; forming ion stoppers on the corresponding island-shaped amorphous silicon layers; defining channel regions and source and drain ohmic contact regions by doping ions on the island-shaped amorphous silicon layers using the ion stoppers as masks; removing the ion stoppers; forming a first insulating layer covering the amorphous silicon layer; crystallizing the amorphous silicon layers to form polysilicon layers by irradiating laser beams on the first insulating layer; forming a gate electrode on the first insulating layer; forming a second insulating layer covering the gate electrode and the exposed polysilicon layers; patterning the second insulating layer to have contact holes to expose source and drain ohmic contact regions; and forming source and drain electrodes on the second insulating layer, the source and drain electrodes contacting the source and drain ohmic contact regions, respectively, via the contact holes.

In another aspect of the invention, the principles of the present invention provides a thin film transistor (TFT), including: a substrate; plural active layers above the substrate; spaces between the substrate and the plural active layers; a first insulating layer formed on the active layers; a gate electrode on the first insulating layer over the plural active layers; a second insulating layer covering the gate electrode and the active layers, the second insulating layer having contact holes exposing both sides of the plural active layers; and source and drain electrodes on the second insulating layer while having electrical connection to the both sides of the active layers via the contact holes of the second insulating layer.

In another aspect, the principles of the present invention provides a thin film transistor (TFT), including: a substrate; plural active layers having cave-shaped-spaces between the active layers and the substrate, first-doped source and drain regions; silicon layers doped twice and having electrical connection with the first doped source and drain regions; a first insulating layer formed on the active layer; and a gate electrode formed on the first insulating layer.

In another aspect of the invention, the principles of the present invention provide a fabrication method of the thin film transistor (TFT), including: providing a substrate; depositing metallic material for a source and drain electrodes on the substrate; forming a space; forming a first amorphous silicon layer on the source and drain electrodes; forming a second amorphous silicon layer covering the first electrode and a substance; forming a first insulating layer on the second amorphous silicon layer; and forming gate electrode on the first insulating layer, corresponding to active layer.

In another aspect of the invention, the principles of the present invention provides a TFT, including: a substrate; plural active layers having a space between the substrate and the active layer; the first insulating layer covering the plural active layers; source and drain electrodes having the connection with the active layers; and a gate electrode corresponding to the active layers.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF ILLUSTRATED EMBODIMENTS

Reference will now be made to embodiments of the present invention, examples of which are illustrated in the accompanying drawings.

Figure 1A:
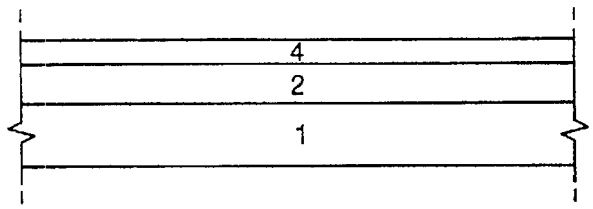
FIGS. 1a to 1d show cross sectional views illustrating the fabrication process steps of a TFT according to the related art.
Figure 1B:
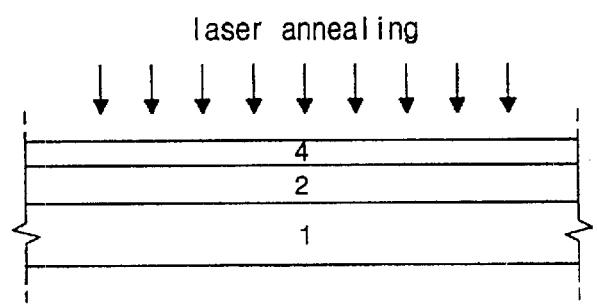
Figure 1C:
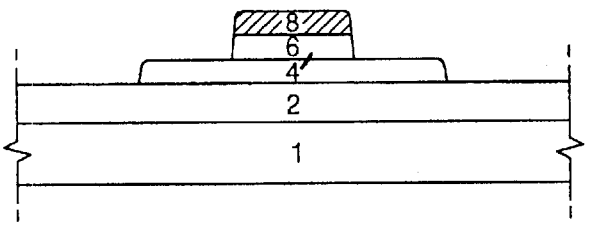
Figure 1D:
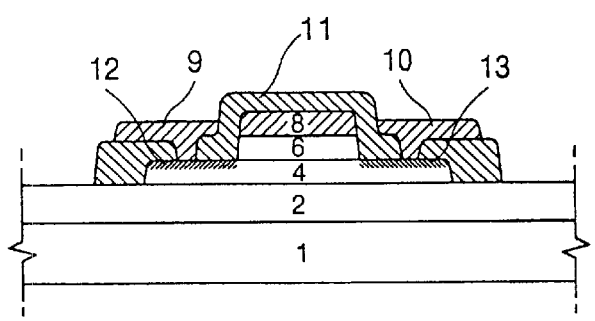
Figure 2:
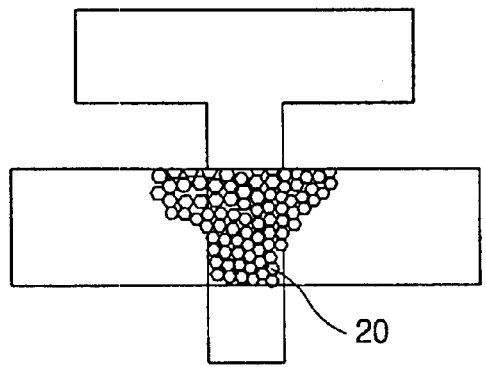
FIG. 2 shows an enlarged plain view of a portion of a TFT according to related art.
Figure 3:
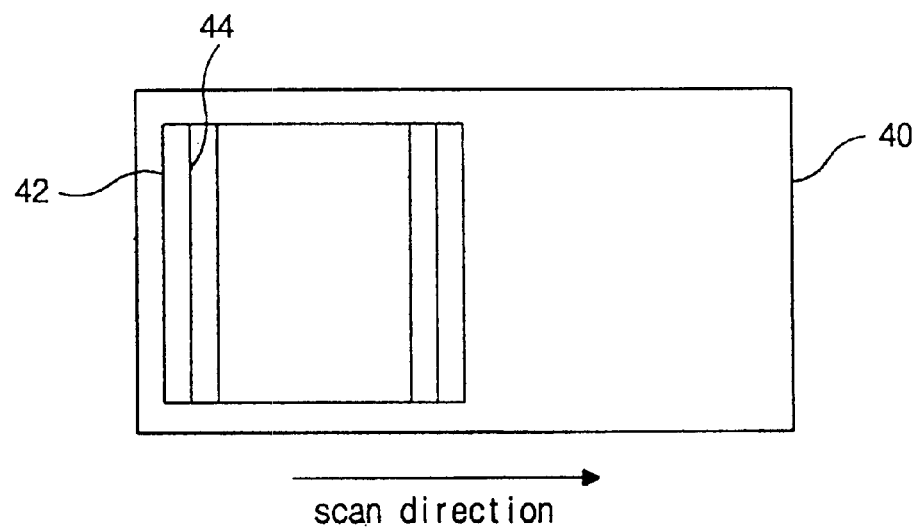
FIG. 3 is a plan view illustrating a related art laser crystallization method.
Figure 4:
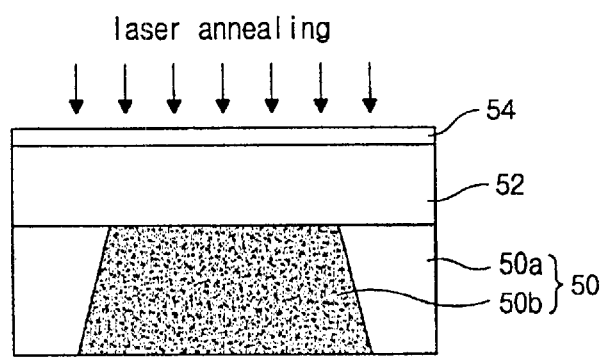
FIG. 4 is a plan view illustrating the fabrication of a bridge structure in a related art.
Figure 5:
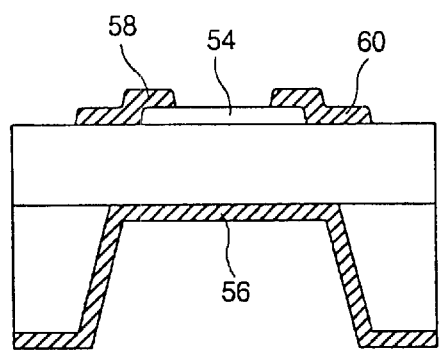
FIG. 5 is a cross sectional view illustrating the bridge structure of a related art TFT.
Figure 6:
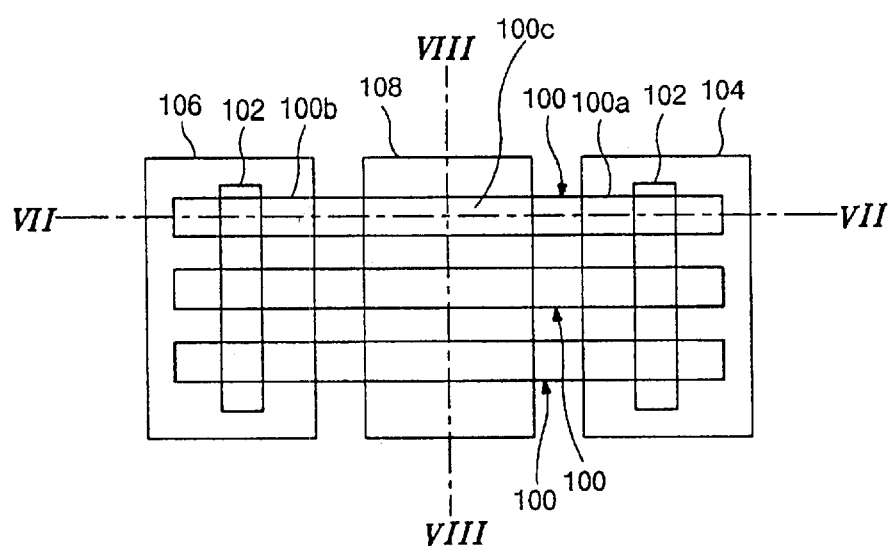
FIG. 6 is a plan view illustrating a TFT according to a first embodiment of the present invention.

FIG. 6 is a plan view illustrating a thin film transistor (TFT) according to a first embodiment of the invention. In particular, FIG. 6 shows a coplanar type TFT. That TFT has plural polycrystalline silicon layers 100, each of which includes a channel region 100c and source and drain ohmic contact regions 100a and 100b at the sides of the polycrystalline silicon layer 100. The source and drain ohmic contact regions 100a and 100b are doped by N-type or P-type ions. A gate electrode 108 is formed adjacent the channel regions 100c. Source and drain electrodes 106 and 104, positioned on the sides of the gate electrode 108, have electrical connections to the source and drain ohmic contact regions 100a and 100b via contact holes.

The illustrated embodiment TFT has plural active layers 100 and plural channel regions 100c. The plural channel regions 100c are connected in parallel. That improves the electrical characteristics of the composite channel region.

FIGS. 7a to 7e are cross sectional views taken along line VII—VII of FIG. 6, and thus show only one of the paralleled active layers.

Figure 7A:
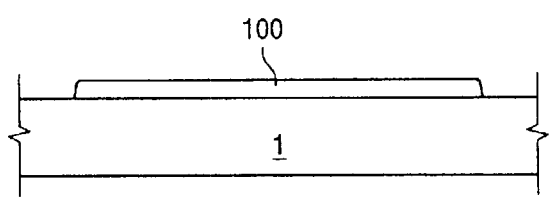
FIGS. 7a to 7e are cross sectional views taken along line VII—VII of FIG. 6.

Referring to FIG. 7a, amorphous silicon is deposited on a substrate 1 and then patterned in the shape of an island to form an active layer 100.

Figure 7B:
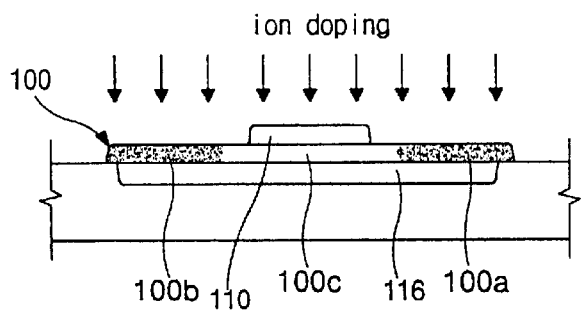

FIG. 7b shows ion doping of the amorphous silicon layer 100. Before doping an ion stopper 110 is formed on the amorphous silicon layer 100 above where a channel region 100c is to be located. The ion stopper 110 can be an organic photoresist layer or an inorganic insulating layer. Thus, the amorphous silicon layer 100 is doped, except at the channel region.

The characteristics of the TFT can be varied by the gas used during the doping process. For example, using $H_2B_6$, which includes a group III element, defines a P-type TFT while using $PH_3$, which includes a group V, element defines an N-type TFT.

A space 116 between the amorphous silicon layer 100 and the substrate 1 is created by etching the upper side of the substrate 1. To etch the upper side of the substrate 1, a buffered-HF solution having a very high etch rate is employed.

Figure 7C:
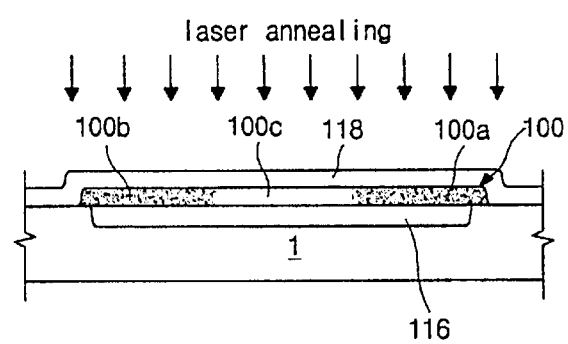

FIG. 7c illustrates the crystallization process of the amorphous silicon 100. A first insulating layer 118 is formed over the amorphous silicon layer 100. Then, laser beams irradiate the first insulating layer 118 such that the amorphous silicon layer 100 is crystallized by laser annealing. The insulating layer acts as an antireflection layer.

Figure 7D:
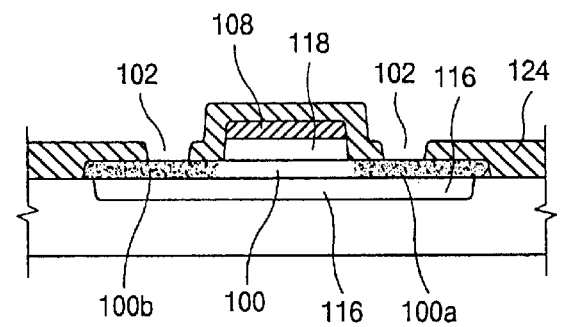

Referring to FIG. 7d, a gate electrode 108 is then formed by deposition and patterning. When patterning, the first insulating layer 118 and the gate electrode 108 can be patterned at the same time or individually. The patterned first insulating layer 118 acts as a gate insulating layer. After that, a second insulating layer 124 is formed over the gate electrode 108 and the source and drain ohmic contact regions 100b and 100a. The second insulating layer 124 is then patterned to form contact holes 102 that expose the source and drain ohmic contact regions 100b and 100a.

Figure 7E:
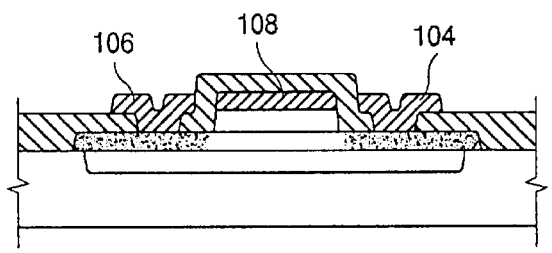

As shown in FIG. 7e, source and drain electrodes 106 and 104 are formed on the second insulating layer such that they have electrical connections to the source and drain ohmic contact regions 100b and 100a, respectively, through the contact holes 102.

Figure 8:
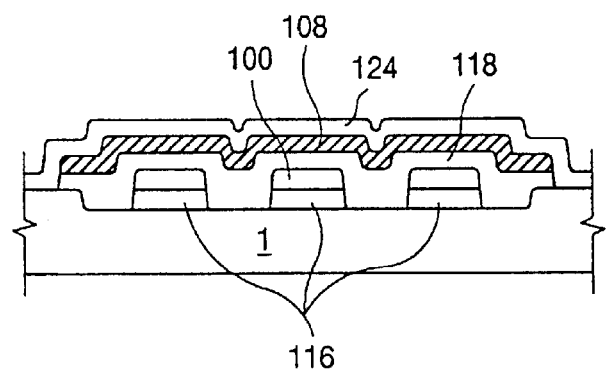
FIG. 8 shows the cross sectional view taken along line VIII—VIII of FIG. 6.

FIG. 8 shows a cross sectional view taken along line VIII—VIII of FIG. 6. The substrate 1 has etched-spaces 116 that are bridged by the plural polycrystalline active layers 100. The first insulating layer 118 (which act as gate insulators) is over the active layer 100 and substrate, filling in the remaining portions of the etched-parts of the substrate 1. The gate electrode 108 and the second insulating layer 124 are formed on the first insulating layer 118.

Figure 9A:
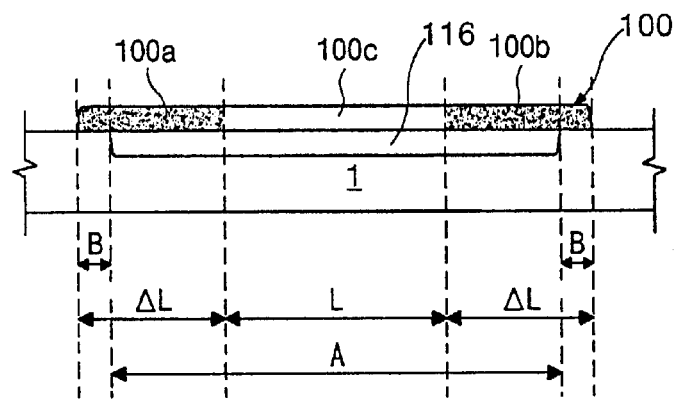
FIGS. 9a and 9b show cross sectional views illustrating crystallization by a laser annealing technique.
Figure 9B:
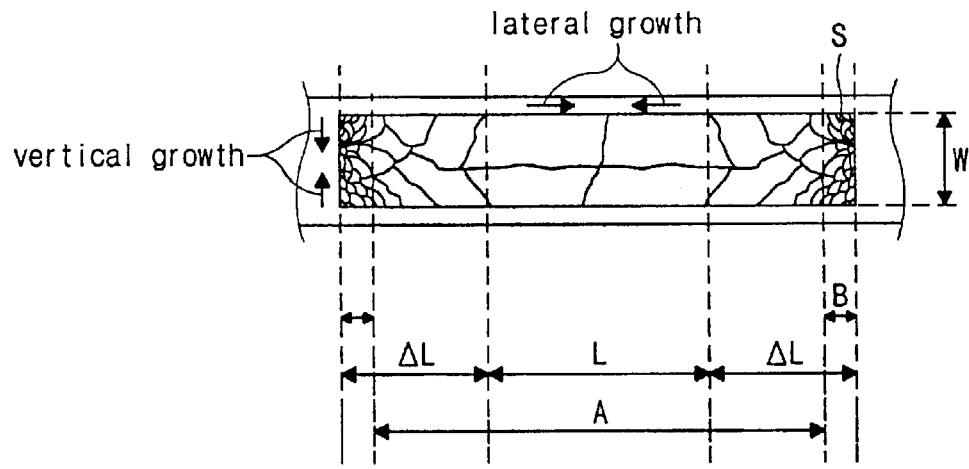

FIGS. 9a and 9b show cross sectional views illustrating the function of the etched-spaces 116 during laser annealing crystallization. The laser crystallization process begins by irradiating laser beams on the substrate 1 and on the amorphous silicon layer 100. The density of the laser energy should be enough to melt the amorphous silicon. When laser irradiation stops, the amorphous silicon layer cools down almost immediately and becomes polycrystalline silicon. Beneficially, the density of the laser energy preferably ranges between 200 and 250 mJ/cm$^2$.

As shown in FIG. 9a, the cooling of the melted amorphous silicon layer 100 is not uniform. In the "A" of the active layer 100, which corresponds to the section over the etched-space 116, cooling is relatively slow, while in area "B", which corresponds to the section on the substrate, cooling is relatively fast. The difference in solidification rates is due to the etched-spaces 116 having a lower thermal conductivity than the substrate. Latent heat produced by laser irradiation in area "B" is diffused into the substrate 1. Thus, the molten silicon starts to solidify relatively rapidly at the interface between the silicon and the substrate. On the other hand, the latent heat in area "A" is not diffused as much. Thus, the molten silicon begins solidifying from the edge and remains in a liquid state for a relatively long time over the etched-space 116.

Referring to FIG. 9b, the cooling starting points or "seeds" are generated at random in the area "B". Uniform grains occur from the numerous crystal nuclei that become the starting points or "seeds". Grain growth ceases when the grain boundaries come in contact with each other. However, the silicon in area "A" remains in a liquid state for a relatively long time. Due to the fact that seeds "S" are created in area "B", a lateral growth of the seeds from area "B" into the area "A" occurs. Furthermore, the vertical growth ceases around the center of the thickness "W". Owing to this phenomena, the slower solidification rate and the lateral growth of grains are very effective in enlarging the grains in area "A". The grain size in area "A" depends on the thermal storage capacity of the etched-space 116. This can be controlled by the shape and the size of the etched-space 116.

When the polycrystalline silicon produced by the foregoing method is used to make a TFT, due to the fact that such a thin-film transistor (TFT) has an active layer 100 with large grains and fewer grain boundaries, the characteristics of the thin-film transistor are improved.

As shown in FIGS. 9a and 9b, the lateral growth velocity of the grains depends on the length "ΔL" of the source and drain ohmic contact regions 100a and 100b. As that length becomes longer, the growth velocity becomes less during the crystallization process. When the length "L" of the channel region 100c and the thickness "W" of the active layer 100 are reduced in the fixed area "A", the total area of the grain boundaries is reduced.

To obtain the best results, which can be comparable to those of a mono-crystal grain (which is ideal), the lengths "ΔL" and "L" and the thickness "W" should be optimized. In one embodiment, the preferred values are about 5 μm for the length "ΔL", about 6 μm for the length "L" and about 5 μm for the thickness "W".

Another aspect of the invention relates to methods of forming spaces between the substrate and the plural active layers. While etching the substrate, to prevent the polycrystalline silicon from developing internal stresses or cracks, a bridge structure having an arch shape and piers can be used.

Figure 10A:
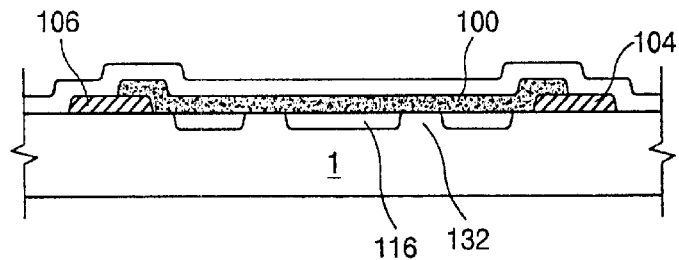
FIGS. 10a to 10e show cross sectional views illustrating the fabrication of a bridge structure.
Figure 10B:
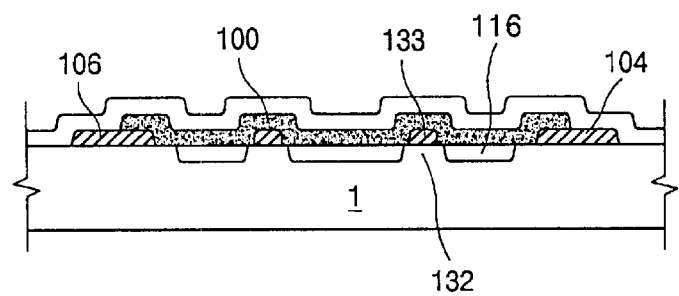
Figure 10C:
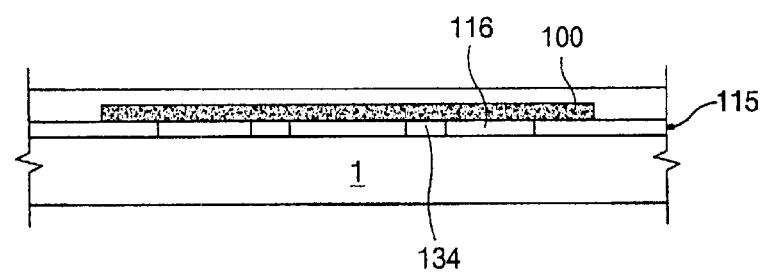
Figure 10D:
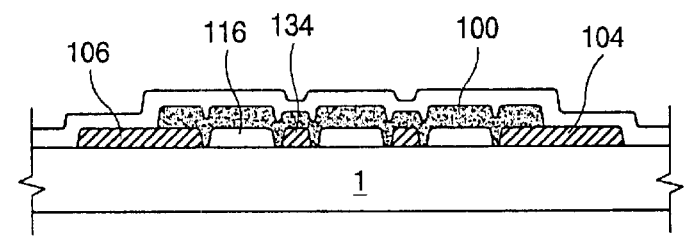
Figure 10E:
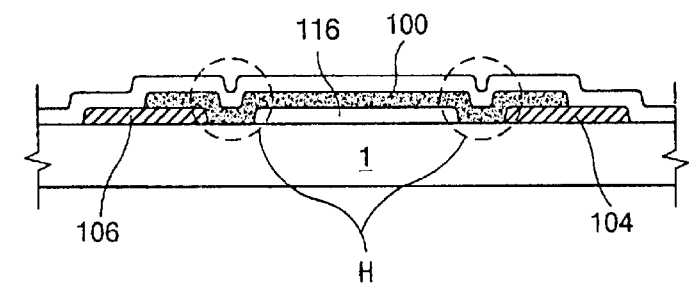

FIGS. 10a and 10b are cross sectional views illustrating a method of forming spaces by etching the upper part of the substrate, while FIGS. 10c to 10e are cross sectional views illustrating a method of forming spaces by etching a layer interposed between the substrate and the active layers.

FIG. 10a, which is similar to FIG. 7c, shows a cross sectional view illustrating a method of forming piers 132. Plural amorphous silicon layers 100 are formed on a substrate 1. Etching the upper side of the substrate 1 forms the spaces 116 between the substrate 1 and the amorphous silicon layers 100. While etching the substrate 1, a plurality of non-etched portions or piers 132 are formed to support the amorphous silicon layer 100. The etching process may include a masking process for blocking the portions where the piers 132 are formed. The structure of the piers 132 prevents the amorphous silicon layer 100 from physical strain such as longitudinal stress or axial stress. The electrodes 104 and 106, formed before forming the active layer 100, can serve as source and drain electrodes for a TFT. FIG. 10b, which is similar to FIG. 10a, illustrates a method of forming auxiliary piers 133. When forming the electrodes 104 and 106, the auxiliary piers 133 are also formed on the substrate 1. Then, the amorphous silicon 100 is deposited on the substrate 1 and on the auxiliary piers 133. After that, the spaces 116 are formed by etching the substrate 1.

As shown in FIG. 10c, a forming-space substance 115, such as silicon oxide ($SiO_2$) or Chrome, is deposited on the substrate 1. Then the amorphous silicon layer 100 is subsequently formed. The amorphous silicon layer 100 is formed into an island shape by patterning. Then the substance 115 is selectively etched using a mask technique to form the spaces 116 and to leave non-etched portions 134, which serve as piers or supporters for the active layers 100.

Referring to FIG. 10d, a metallic material is first deposited on the substrate 1. Then, source and drain electrodes 106 and 104 are formed by patterning the metallic material. The patterned metallic material includes not only source and drain portions 106 and 104, but also portions for piers 134 and portions corresponding to the spaces 116. Thus, during patterning, a pluralities of piers 134 are formed simultaneously. The amorphous silicon layer 100 is then formed on the patterned metallic material. Then, the portions of the metallic material corresponding to the spaces 116 are etched and removed using a mask. Therefore, the remaining portions of the metallic material are piers 134 and source and drain electrodes 106 and 104. The number of the piers 134 can be more than two.

FIG. 10e shows a cross sectional view illustrating a method of forming a space 116 having no piers 134. The source and drain electrodes 106 and 104 are first formed on the substrate 1. Then, the metallic material for the space 116 is formed between source and drain electrodes 106 and 104. After that, an amorphous silicon layer 100 that covers the source and drain electrodes and the metallic material is formed. The space 116 is then formed by removing the metallic material. In this embodiment, the border "H" between the source and drain electrodes and the cave-shaped-space 116 indicates a bridge structure having an arch shape. Silicon oxide ($SiO_2$) can be used to form the space 116 instead of a metallic material.

Figure 11:
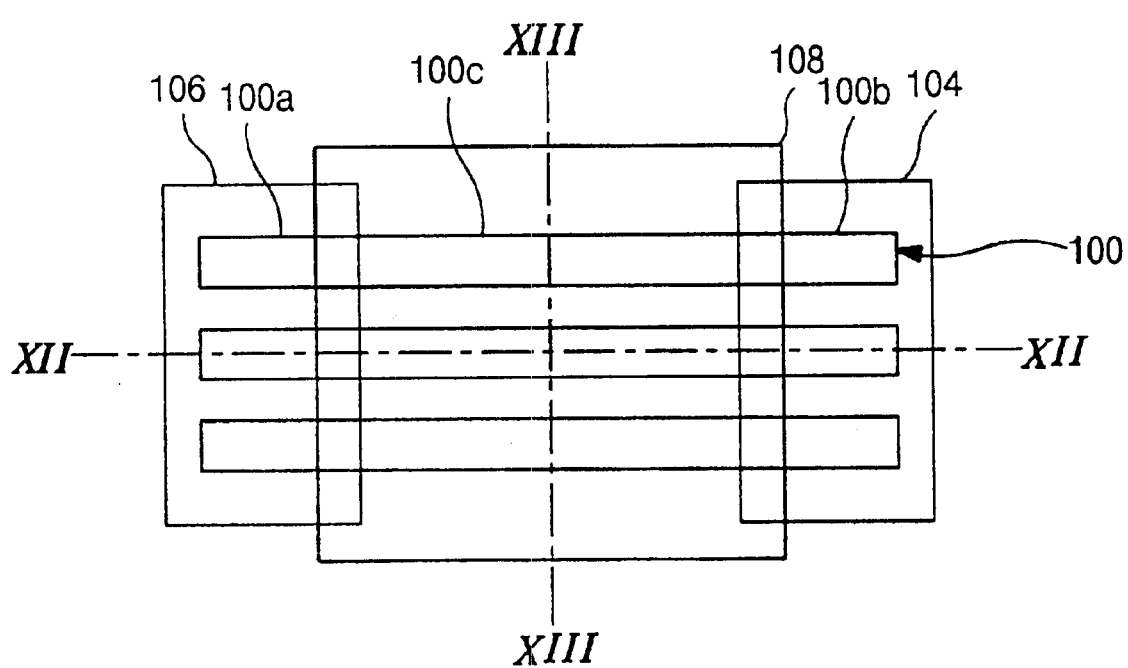
FIG. 11 shows a plan view illustrating a TFT according to another embodiment of the invention.

FIG. 11 shows a plan view illustrating a poly-silicon TFT made using a method according to FIGS. 10a to 10e. Moreover, FIG. 11 shows a staggered type TFT. The TFT has plural polycrystalline silicon layers 100, each of which include a channel region 100c and source and drain ohmic contact regions 100a and 100b on the sides of the polycrystalline silicon layers 100. The source and drain ohmic contact regions 100b and 100a are doped by impurity ions. A gate electrode 108 is formed adjacent the channel regions 100c. Source and drain electrodes 106 and 104, positioned on the sides of the gate electrode 108, have electrical connections to the source and drain ohmic contact regions 100b and 100a.

Figure 12A:
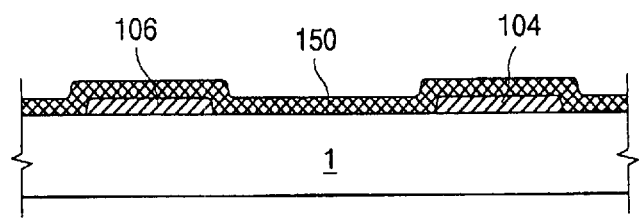
FIGS. 12a to 12e show cross sectional views taken along line XII—XII of FIG. 11.

FIGS. 12a to 12e illustrate a fabrication process along line XII—XII of FIG. 11. Referring to FIG. 12a, source and drain electrodes are formed on the substrate 1. Then, a space-forming substance 150 is deposited over the source and drain electrodes 106 and 104 and over the substrate 1. The space-forming substance 150 is beneficially made of silicon oxide ($SiO_2$) or silicon nitride ($SiN_x$). It could also be made of metallic material selected from a group consisting of Molybdenum, Chrome, Aluminum, Titanium, Tantalum, etc., which can also be the material for the source and drain electrodes.

Figure 12B:
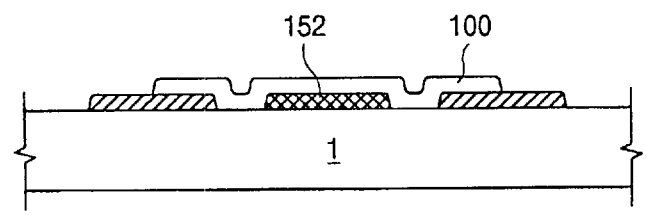

As shown in FIG. 12b, the space-forming substance 150 is patterned in an island shape 152 that is spaced apart from the source and drain electrodes 106 and 104. An amorphous silicon layer 100 then covers the island shape 152 and part of the source and drain electrodes.

Figure 12C:
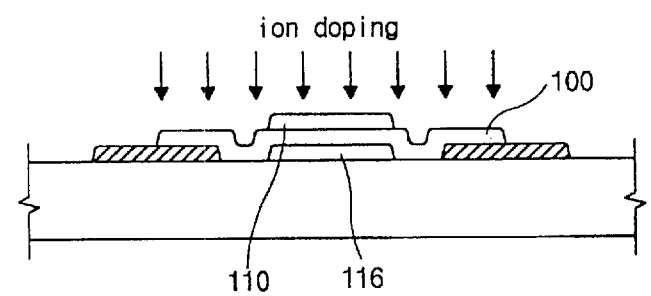
Figure 12D:
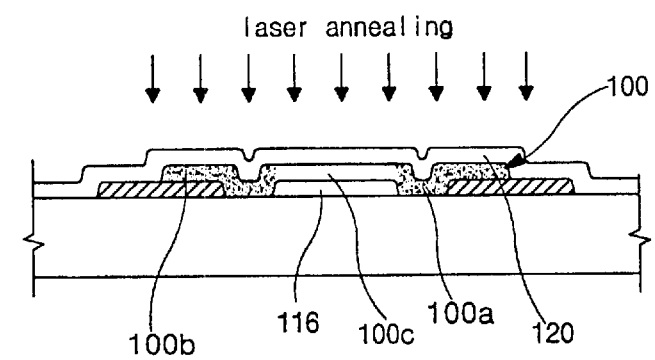

Referring to FIG. 12c, a space 116 is then formed by etching the island shape 152. Then, an ion stopper 110 is formed on the amorphous silicon layer 100 over the space 116. Then an ion-doping process is used on the active layer 100 to produce a channel region 100c and source and drain ohmic contact regions 100b and 100a, see FIG. 12d. The ion stopper acts as a mask. After stripping the ion stopper 110 off, a first insulating layer 120 is formed on the amorphous silicon layer 100. Then laser crystallization is performed. During crystallization, a lateral growth from the sides of the space 116 occurs (see FIGS. 9a and 9b).

Figure 12E:
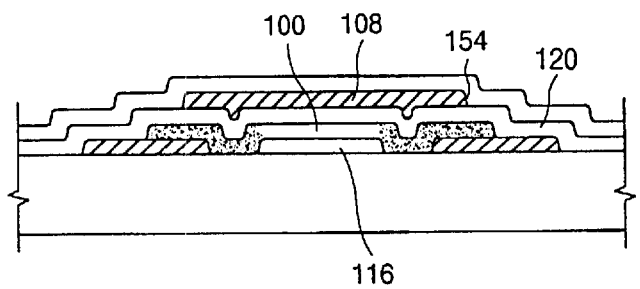

Thus the fabrication of the TFT is completed, as shown in FIG. 12e. After forming a gate electrode 108 on the gate insulating layer 120 and forming a second insulating layer 154 the fabrication of the TFT is complete.

Figure 13:
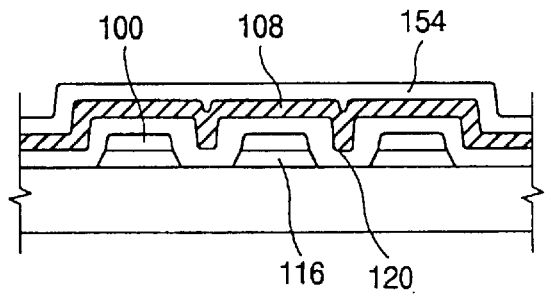
FIG. 13 shows a cross sectional view taken along line XIII—XIII of FIG. 11.

FIG. 13 shows a cross sectional view taken along line XIII—XIII of FIG. 11. The plurality of active layers 100 are connected in parallel. The first insulating layer 120 fills between the spaces 116. The gate electrode 108 is formed on the first insulating layer 120 and then the second insulating layer 154 is formed on the gate electrode 108.

The principles of the present invention can fabricate a TFT having a LDD (lightly doped drain) structure. The LDD structure is applied to a MOS (metal oxide silicon) transistor, to protect the drain ohmic contact region from deterioration caused by hot carriers. This method uses different ion densities to decrease deterioration caused by hot carriers. Thus, the ion doping process for the LDD-TFT is performed twice.

Figure 14A:
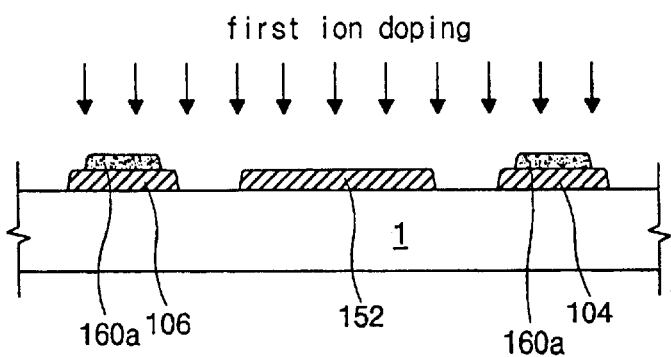
FIGS. 14a to 14d show cross sectional views illustrating a TFT according to another embodiment of the present invention.

Referring to FIG. 14a, source and drain electrodes 106 and 104 are formed on the substrate 1. Then a space-forming substance 152 is formed between the source and drain electrodes 106 and 104. An island-shaped amorphous silicon layer 160a is then formed on the source electrode and on the drain electrodes. Then a first doping process is then performed.

Figure 14B:
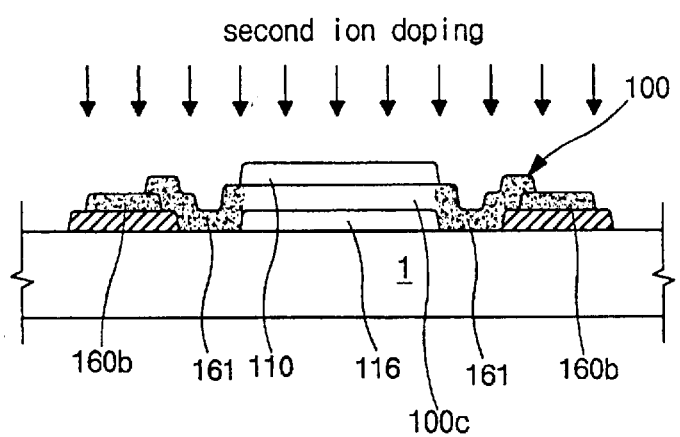

As shown in FIG. 14b, an amorphous silicon layer 100 that covers the space-forming substance 152 and part of the source and gate electrodes and their island-shaped amorphous silicon layers 160a is formed. Then, on the amorphous silicon layer 100 an ion stopper 110 is formed over to the space-forming substance 152. Subsequently, the second ion doping process is performed. The space 116 is then created by etching the space-forming substance 152. Moreover, the ion stopper 110 is removed.

Owing to these processes, a difference between the first doping density and second doping density is created. Let us suppose that the first doping density is "N" and the second doping density is "M". The island-shaped silicon layer 160a (in FIG. 14a) has the ion density "N" while the island-shaped silicon layer 160b (in FIG. 14b) has the ion density "N+M". Moreover, the source and drain regions 161 adjacent the amorphous silicon layer 100 has the ion density "M". Thus, a channel region 100c and source and drain regions 161 are defined by the second doping ions using the ion stopper 110 as a mask.

Figure 14C:
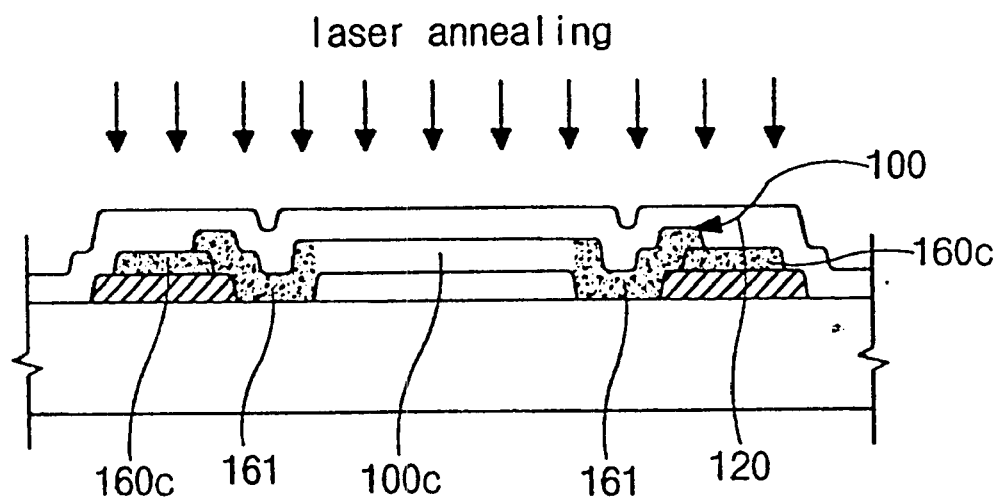

Referring to FIG. 14c, a first insulating layer 120 that covers the island-shaped silicon layer 160c and the amorphous silicon layer 100 is formed. Then a laser crystallization process is performed. Thus, a channel region 100c and source and drain ohmic contact regions 160c are produced.

The source and drain regions 161 and the ohmic contact regions 160c have the same general electrical characteristics, but have different doping density levels.

Figure 14D:
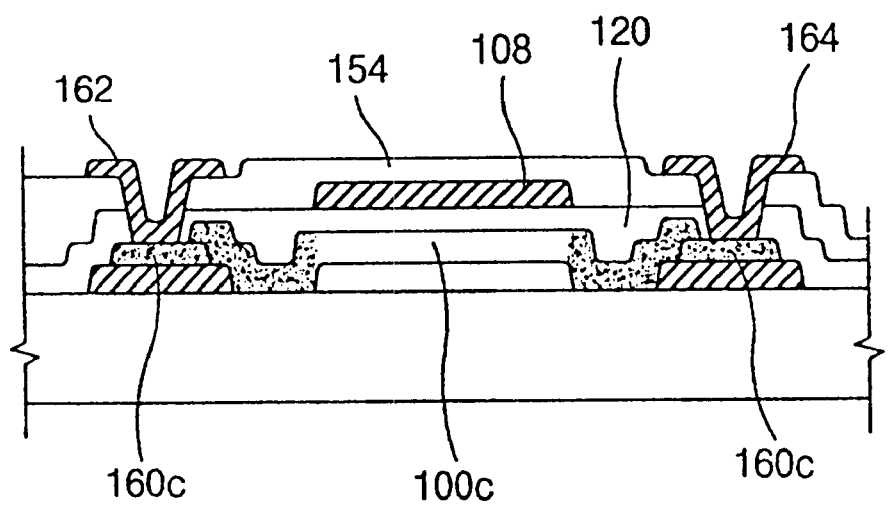

As shown in FIG. 14d, a gate electrode 108 is then formed on the first insulating layer 120, and then a second insulating layer 154 is formed on the gate electrode 108. Contact holes that penetrate the first and second insulating layers are formed to expose the surface of the source and drain ohmic contact regions 160c. Finally, source and drain outer electrodes 162 and 164 that electrically connect to the ohmic contact regions 160c are formed.

An array substrate TFT for a LCD device having driving circuits fabricated using the above explained methods for forming polysilicon layer also can be produced.

The LCD device consists of an LC panel and external drive circuits. Technique for connecting the external drive circuits to the LC panel includes WB (wire bonding), COB (chip on board), TAB (tape automated bonding), and COG (chip on glass) bonding. Nowadays, lap top computers include pixel arrays made of amorphous silicon and drive circuits made of mono-crystal silicon. However, because of the techniques of polysilicon crystallization described above, it is possible to fabricate TFTs of an LC panel and its drive circuits together. This is possible because the foregoing techniques of producing TFTs results in such large-sized-grain polycrystalline silicon that the polycrystalline silicon can have electrical characteristics comparable to mono-crystal silicon, thus leading to lower production costs.

Figure 15:
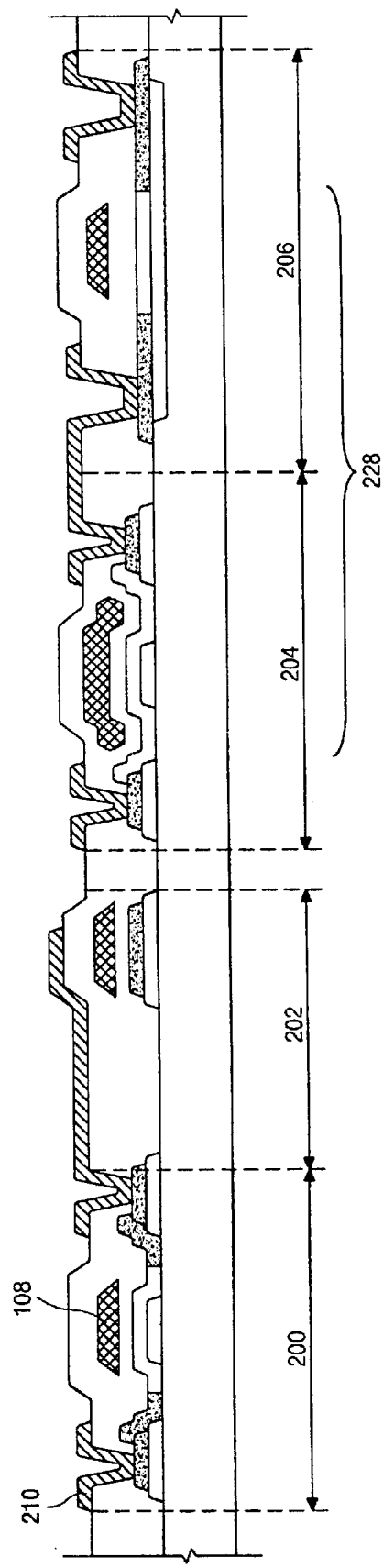
FIG. 15 shows a cross sectional view illustrating an array substrate for a LCD device according to the principles of the present invention.

FIG. 15 shows a cross sectional view of an array substrate having drive circuits for a LCD device. The CMOS drive circuit 228(Complementary metal oxide silicon) is comprised of an N-type TFT 204 and a P-type TFT 206. The pixel 202 and the switching TFT 200 are located on the same substrate. The CMOS drive circuit 228 has a connection with the gate and source electrodes 108 and 210 of the switching TFT 200 and thus controls the switching TFT 200. The fabrication method for the TFT 200 and the CMOS 228 is as described above. Thus, an additional description is not required.

As described above, according to the principles of the present invention, a TFT has a parallel connection of plural channel regions to improve its electrical characteristics. A space between the substrate and the active layer aids forming large grains for the polycrystalline silicon layer of the TFT. Furthermore, such fabrication techniques can be used to form a LCD device having switching TFTs, and pixel and drive circuit fabricated as one body.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:

a substrate having an upper side with a furrow;

a plurality of active layers on the upper side that span the furrow such that spaces are defined between the substrate and the active layers;

a first insulating layer on the plurality of active layers;

a gate electrode on the first insulating layer over the plurality of active layers; and source and drain electrodes contacting the plurality of the active layers, wherein there are multiple furrows under an active layer.

2. The thin film transistor of claim 1, wherein the furrow is formed by a slot-shaped trench.

3. The thin film transistor of claim 1, wherein the active layers span the furrow and contact the upper side of the substrate.

4. The thin film transistor of claim 1, further comprising a second insulating layer over the gate electrode and the active layers, the second insulating layer having contact holes penetrating to the active layers, wherein the source and drain electrodes contact the active layers through the contact holes.

5. The thin film transistor of claim 4, wherein the source and drain electrodes are under the active layers.

6. The thin film transistor of claim 1, further including a pier between furrows, wherein the pier supports an active layer.

7. The thin film transistor of claim 1, further comprising doped source and drain regions under the source and drain electrodes, respectively, wherein the doped source and drain regions are amorphous silicon.

8. The thin film transistor of claim 1, wherein said plurality of active layers are connected in parallel.

9. The thin film transistor of claim 8, wherein each of said plurality of active layers includes a drain region, a source region, and a channel region.

10. The thin film transistor of claim 8, wherein each of said plurality of active layers is polysilicon.

11. The thin film transistor of claim 10, wherein the polysilicon is comprised of a central region having relatively large crystal grain sizes and end regions comprised of relatively small crystal grain sizes.

12. A display array, comprising:

a substrate having an upper side with a furrow;

a CMOS transistor having an N-type TFT and a P-type TFT that are formed over said upper side; and a thin film switching transistor over said upper side and that is in electrical communication with said CMOS transistor, said thin film switching transistor including;

a plurality of polysilicon active layers over the upper side that span the furrow so as to define spaces between the substrate and the active layers;

a first insulating layer on the plurality of active layers;

a gate electrode on the first insulating layer over the plurality of active layers; and source and drain electrodes contacting the plurality of the active layers.

13. A display array according to claim 12, wherein said N-type TFT has a polysilicon active layer.

14. A display array according to claim 12, further including a space between the substrate and the polysilicon active layer of N-type TFT.

15. A display array according to claim 12, further including a pixel element over said substrate.

* * * * *